(12) United States Patent
Li

(10) Patent No.: US 12,432,902 B2
(45) Date of Patent: Sep. 30, 2025

(54) SEMICONDUCTOR STRUCTURE, METHOD FOR FORMING SEMICONDUCTOR STRUCTURE, AND MEMORY

(71) Applicant: Changxin Memory Technologies, Inc., Anhui (CN)

(72) Inventor: Xiaojie Li, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 602 days.

(21) Appl. No.: 17/940,577

(22) Filed: Sep. 8, 2022

(65) Prior Publication Data

US 2024/0008247 A1    Jan. 4, 2024

Related U.S. Application Data

(63) Continuation of application No. PCT/CN2022/105252, filed on Jul. 12, 2022.

(30) Foreign Application Priority Data

Jun. 30, 2022   (CN) .......................... 202210773003.3

(51) Int. Cl.
| | | |
|---|---|---|
| *H01L 27/108* | (2006.01) | |
| *G11C 5/06* | (2006.01) | |
| *H10B 12/00* | (2023.01) | |

(52) U.S. Cl.
CPC ........ *H10B 12/0387* (2023.02); *G11C 5/063* (2013.01); *H10B 12/053* (2023.02);
(Continued)

(58) Field of Classification Search
CPC .. H10B 12/0387; H10B 12/053; H10B 12/39; H10B 12/482; H10B 12/488; H10B 12/05; H10B 12/00; G11C 5/063; H10D 1/714
See application file for complete search history.

(56) References Cited

U.S. PATENT DOCUMENTS 11,557,604 B2   1/2023   Woo et al.
11,729,972 B2   8/2023   Son et al.
(Continued)

FOREIGN PATENT DOCUMENTS

CN   109616474 A   4/2019
CN   112310088 A   2/2021
(Continued)

OTHER PUBLICATIONS

Search Report dated Mar. 7, 2024, issued in related Taiwan Application No. 112122658 (3 pages).
(Continued)

*Primary Examiner* — Mohammed R Alam
(74) *Attorney, Agent, or Firm* — Sheppard Mullin Richter & Hampton LLP

(57) ABSTRACT

The semiconductor structure forming method includes: providing a base, where the base includes a substrate, a plurality of first semiconductor layers and second semiconductor layers; forming a first sidewall and a second sidewall, each including a support layer and an isolation layer formed on a side of the support layer; forming a plurality of recessed portions separated by the first sidewall, the second sidewall, and the second semiconductor layers, where the recessed portions extend in a horizontal direction and are stacked in a vertical direction; forming a first conductive layer and a filling layer in each recessed portion; removing isolation layers located on a side of the first sidewall that is away from the second sidewall and on a side of the second sidewall that is away from the first sidewall; and removing the first conductive layer located at a bottom of each recessed portion.

14 Claims, 8 Drawing Sheets

(52) U.S. Cl.
CPC ........... *H10B 12/39* (2023.02); *H10B 12/482* (2023.02); *H10B 12/488* (2023.02)

(56) References Cited

U.S. PATENT DOCUMENTS

| | | |
|---|---|---|
| 2019/0355744 A1 | 11/2019 | Kim et al. |
| 2021/0057416 A1 | 2/2021 | Kim et al. |
| 2021/0104526 A1 | 4/2021 | Son |
| 2021/0202457 A1 | 7/2021 | Choi et al. |
| 2021/0249415 A1 | 8/2021 | Kang et al. |
| 2021/0288047 A1 | 9/2021 | Lee et al. |
| 2021/0375935 A1 | 12/2021 | Ling et al. |
| 2022/0199627 A1* | 6/2022 | Fishburn ................ H10B 12/05 |
| 2023/0217645 A1* | 7/2023 | Kim ....................... H10B 12/03 257/296 |

FOREIGN PATENT DOCUMENTS

| | | |
|---|---|---|
| CN | 112635471 A | 4/2021 |
| CN | 112992914 A | 6/2021 |
| CN | 113380829 A | 9/2021 |
| CN | 114582809 A | 6/2022 |
| TW | 202145530 A | 12/2021 |

OTHER PUBLICATIONS

PCT International Search Report and the Written Opinion mailed Mar. 22, 2023, issued in related International Application No. PCT/CN2022/105252, with English translation (18 pages).

* cited by examiner

SEMICONDUCTOR STRUCTURE, METHOD FOR FORMING SEMICONDUCTOR STRUCTURE, AND MEMORY

CROSS-REFERENCE TO RELATED APPLICATIONS

This application is a continuation application of International Patent Application No. PCT/CN2022/105252, filed on Jul. 12, 2022, which claims priority to Chinese Patent Application No. 202210773003.3, filed on Jun. 30, 2022 and entitled "SEMICONDUCTOR STRUCTURE, METHOD FOR FORMING SEMICONDUCTOR STRUCTURE, AND MEMORY." The above-referenced applications are incorporated herein by reference in their entirety.

TECHNICAL FIELD

This disclosure relates to the field of semiconductor technologies, and specifically, to a semiconductor structure, a method for forming the semiconductor structure, and a memory.

BACKGROUND

Dynamic random-access memory (DRAM) is widely used in mobile devices such as mobile phones and tablet computers due to its small size, high integration degree, and fast transmission speed.

In the process of manufacturing three-dimensional DRAM, a thin film is usually deposited on the surface of a semiconductor structure by using an atomic layer deposition process, during which the thin film covers all surfaces of the semiconductor structure exposed to the outside environment. This can lead to short circuiting of the structures inside the three-dimensional DRAM due to the interconnection between sidewalls, and can result relatively low yield rate.

It should be noted that the information disclosed in this Background section is merely intended to facilitate understanding of the background of this disclosure, and therefore may include information that does not constitute prior art known to a person of ordinary skill in the art.

SUMMARY

This disclosure aims to overcome the foregoing disadvantage in the prior art, and provide a semiconductor structure, a method for forming the semiconductor structure, and a memory, to avoid short circuiting of structures inside a three-dimensional DRAM and increase the yield rate.

According to an aspect of this disclosure, a method for forming a semiconductor structure is provided. The method may include: providing a base, where the base includes a substrate and a plurality of first semiconductor layers and a plurality of second semiconductor layers that are alternately deposited on the substrate; forming a first sidewall and a second sidewall that penetrate the first semiconductor layers and the second semiconductor layers, where the first sidewall and the second sidewall each include a support layer and an isolation layer formed on a side of the support layer; removing the first semiconductor layers located on a side of the first sidewall that is away from the second sidewall and on a side of the second sidewall that is away from the first sidewall to form a plurality of recessed portions separated by the first sidewall, the second sidewall, and the second semiconductor layers, where each recessed portion extends in a horizontal direction, and the plurality of recessed portions are stacked in a vertical direction; forming, in each recessed portion, a first conductive layer attached to an inner wall of the recessed portion; removing the isolation layers located on the side of the first sidewall that is away from the second sidewall and on the side of the second sidewall that is away from the first sidewall to expose the first conductive layer located at a bottom of each recessed portion on a side close to the support layer; and removing the first conductive layer located at the bottom of each recessed portion on the side close to the support layer.

According to an aspect of this disclosure, a semiconductor structure is provided. The semiconductor structure may include: a base, including a substrate and a plurality of first semiconductor layers and a plurality of second semiconductor layers that are alternately deposited on the substrate, where an orthographic projection of the first semiconductor layer on the substrate is inside an orthographic projection of the second semiconductor layer on the substrate; a first sidewall and a second sidewall, located on two sides of the first semiconductor layers and penetrating the second semiconductor layers, where the first sidewall and the second sidewall each include a support layer and an isolation layer formed on a side of the support layer, the first sidewall, the second sidewall, and the second semiconductor layers separate a plurality of recessed portions, each recessed portion extends in a horizontal direction, and the plurality of recessed portions are stacked in a vertical direction; and a first conductive layer, attached to a sidewall of the recessed portion.

According to an aspect of this disclosure, a semiconductor structure is provided. The semiconductor structure may include: a substrate, including a bit line region, a word line region, and a capacitor region that are deposited side by side, where the word line region includes a first word line region and a second word line region that are deposited on two sides of the bit line region, and the capacitor region includes a first capacitor region deposited on a side of the first word line region that is away from the bit line region and a second capacitor region deposited on a side of the second word line region that is away from the bit line region; a word line structure, formed in the first word line region and the second word line region and including a plurality of sub-word lines that extend in a horizontal direction and are stacked in a vertical direction; a bit line structure, formed in the bit line region and including a plurality of sub-bit lines that extend in the vertical direction and are stacked in the horizontal direction; and a capacitor structure, formed in the first capacitor region and the second capacitor region and including a plurality of storage capacitors that extend in the horizontal direction and are stacked in the vertical direction.

Another aspect of this disclosure is directed to a memory. The memory may include any one of the foregoing semiconductor structures.

According to the semiconductor structure, the method for forming the semiconductor structure, and the memory provided in this disclosure, a plurality of recessed portions that extend in the horizontal direction and are stacked in the vertical direction may be separated by the isolation layer of the first sidewall that is away from the second sidewall, the isolation layer of the second sidewall that is away from the first sidewall, and the second semiconductor layers. The first conductive layer may be formed in each recessed portion, and the first conductive layer between adjacent second semiconductor layers (that is, the first conductive layer located at the bottom of the recessed portion) may be exposed after the isolation layers are removed. Further, the first conductive layer between adjacent second semiconductor layers may be removed by using an anisotropic etching process, to avoid short circuiting of the first conductive layer between two adjacent second semiconductor layers due to interconnection, thereby increasing the yield rate. In this process, the first conductive layer may be used as a lower electrode layer of a subsequently formed storage capacitor to collect charges. In addition, the remaining first conductive layer may be attached to upper surfaces, lower surfaces, and ends of the second semiconductor layers. The first conductive layer may be supported by the second semiconductor layers to prevent the first conductive layer from collapsing, thereby further increasing the yield rate.

It should be understood that the foregoing general description and the following detailed description are merely exemplary and explanatory and are not intended to limit this disclosure.

BRIEF DESCRIPTION OF DRAWINGS

The accompanying drawings and the specification illustrate the embodiments of this disclosure and explain the principles of this disclosure. Apparently, the accompanying drawings in the following descriptions merely represent some embodiments of this disclosure, and a person of ordinary skill in the art may derive other accompanying drawings based on these accompanying drawings without creative efforts.

DESCRIPTION OF REFERENCE NUMERALS

Figure 1:
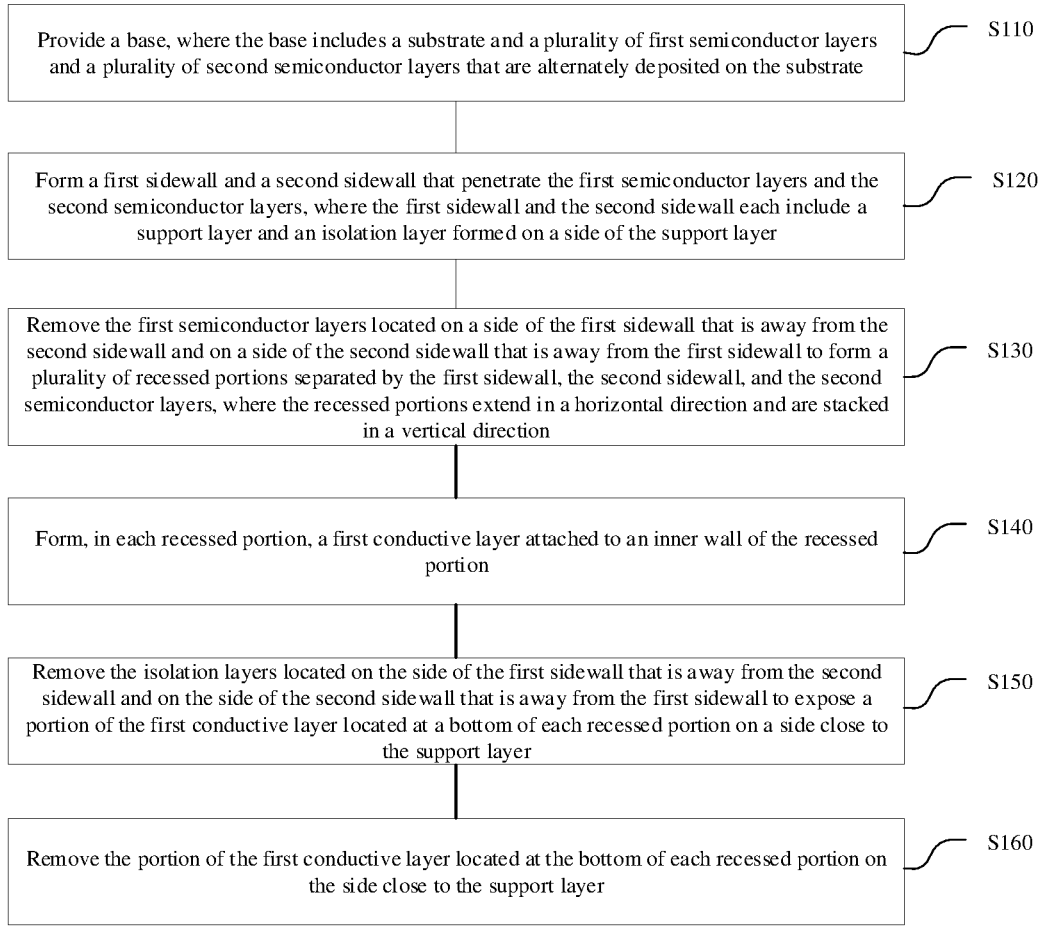
FIG. 1 is a flowchart of a method for forming a semiconductor structure according to an embodiment of this disclosure.

1. base; 11. substrate; 12. first semiconductor layer; 13. second semiconductor layer; 101. first trench; 102. second trench; 103. first accommodation portion; 104. second accommodation portion; 105. third accommodation portion; 106. first isolation trench; 107. second isolation trench; 21. first sidewall; 22. second sidewall; 201. support layer; 202. isolation layer; 110. recessed portion; 3. storage capacitor; 31. first conductive layer; 311. conductive material layer; 312. filling layer; 32. dielectric layer; 33. second conductive layer; 4. first insulation layer; 5. mask layer; 6. protection layer; 7. word line structure; 71. first word line; 72. second word line; and 8. bit line structure.

DETAILED DESCRIPTION OF EMBODIMENTS

Exemplary implementations are described more comprehensively with reference to the accompanying drawings. However, the exemplary implementations can be implemented in a plurality of forms and should not be construed as being limited to the embodiments described herein. On the contrary, these embodiments are provided to make this disclosure comprehensive and complete, and comprehensively convey the ideas of the exemplary implementations to a person skilled in the art. The same reference numerals in the drawings represent same or similar structures, and therefore detailed descriptions of the same structures are omitted. In addition, the accompanying drawings are merely schematic diagrams of this disclosure, and are not necessarily drawn to scale.

Although relative terms such as "top" and "bottom" are used in the specification to describe a relative relationship between one component and another component denoted in the drawing, these terms are used in the specification for convenience only, for example, these terms are based on directions in examples described in the accompanying drawings. It can be understood that, if an apparatus denoted in the drawing is turned with upside down, a component at the "top" becomes a component at the "bottom". When a structure is "above" another structure, it may mean that the structure is integrated on the another structure, or that the structure is "directly" disposed on the another structure, or that the structure is "indirectly" disposed on the another structure by using another structure.

The terms "one", "a", "this", "the", and "at least one" are used to indicate the presence of one or more elements/components/or the like. The terms "include" and "have" are used to indicate an open inclusion and mean that other elements/components/or the like further exist in addition to the listed elements/components/or the like. The words "first", "second", . . . , "fifth", or the like is used only as a mark, and is not intended to limit a quantity of objects.

An embodiment of this disclosure provides a method for forming a semiconductor structure to resolve the foregoing technical problem. FIG. 1 is a flowchart of a method for forming a semiconductor structure according to an embodiment of this disclosure. Referring to FIG. 1, the forming method may include steps S110 to S160.

Step S110: Provide a base, where the base includes a substrate and a plurality of first semiconductor layers and a plurality of second semiconductor layers that are alternately deposited on the substrate.

Step S120: Form a first sidewall and a second sidewall that penetrate the first semiconductor layers and the second semiconductor layers, where the first sidewall and the second sidewall each include a support layer and an isolation layer formed on a side of the support layer.

Step S130: Remove the first semiconductor layers located on a side of the first sidewall that is away from the second sidewall and on a side of the second sidewall that is away from the first sidewall to form a plurality of recessed portions separated by the first sidewall, the second sidewall, and the second semiconductor layers, where each recessed portion extends in a horizontal direction, and the plurality of recessed portions are stacked in a vertical direction.

Step S140: Form, in each recessed portion, a first conductive layer attached to an inner wall of the recessed portion.

Step S150: Remove the isolation layers located on the side of the first sidewall that is away from the second sidewall and on the side of the second sidewall that is away from the first sidewall to expose the first conductive layer located at a bottom of each recessed portion on a side close to the support layer.

Step S160: Remove the first conductive layer located at the bottom of each recessed portion on the side close to the support layer.

According to the method for forming a semiconductor structure provided in this disclosure, a plurality of recessed portions that extend in the horizontal direction and are stacked in the vertical direction may be separated by the isolation layer of the first sidewall that is away from the second sidewall, the isolation layer of the second sidewall that is away from the first sidewall, and the second semiconductor layers. The first conductive layer may be formed in each recessed portion, and the first conductive layer between adjacent second semiconductor layers (that is, the first conductive layer located at the bottom of the recessed portion) may be exposed after the isolation layers are removed. Further, the first conductive layer between adjacent second semiconductor layers may be removed by using an anisotropic etching process, to avoid short circuiting of the first conductive layer between two adjacent second semiconductor layers due to interconnection, thereby increasing the yield rate. In this process, the first conductive layer may be used as a lower electrode layer of a subsequently formed storage capacitor to collect charges. In addition, the remaining first conductive layer may be attached to upper surfaces, lower surfaces, and ends of the second semiconductor layers. The first conductive layer may be supported by the second semiconductor layer to prevent the first conductive layer from collapsing, thereby further increasing the yield rate.

The steps of the method for forming a semiconductor structure provided in the embodiments of this disclosure are described below in detail.

As shown in FIG. 1, a base in provided in step S110, where the base includes a substrate and a plurality of first semiconductor layers and the plurality of second semiconductor layers that are alternately deposited on the substrate.

Figure 2:
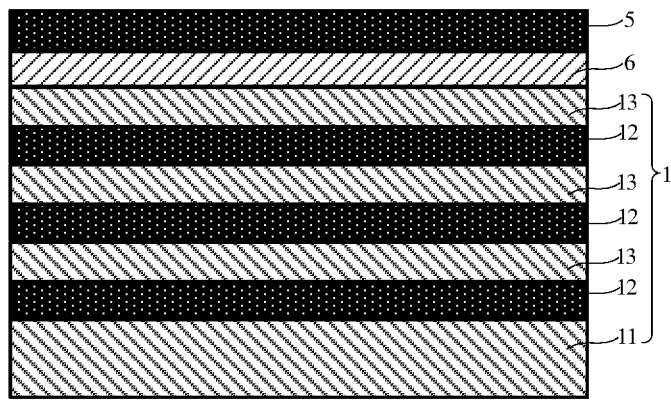
FIG. 2 is a schematic diagram of a base according to an embodiment of this disclosure.

In an embodiment of this disclosure, as shown in FIG. 2, a base 1 may include a substrate 11 and stacked film layers formed on the substrate 11, and the stacked film layers may include a plurality of first semiconductor layers 12 and a plurality of second semiconductor layers 13.

The substrate 11 may have a flat plate structure, and may be in a rectangular, circular, oval, polygonal, or irregular shape. The material of the substrate 11 may be silicon or another semiconductor material. The shape and the material of the substrate 11 are not specifically limited herein.

The first semiconductor layers 12 and the second semiconductor layers 13 may be alternately deposited on the substrate 11. In an embodiment of this disclosure, in the stacked film layers, a film layer in contact with a surface of the substrate 11 is the first semiconductor layer 12, and a film layer farthest away from the substrate 11 is the second semiconductor layer 13.

In some embodiments of this disclosure, the material of the first semiconductor layer 12 may be silicon, silicon-germanium, polycrystalline silicon, silicon oxide, or the like, and the material of the second semiconductor layer 13 may also be silicon, silicon-germanium, polycrystalline silicon, silicon oxide, or the like. Certainly, the materials of the first semiconductor layer 12 and the second semiconductor layer 13 may be other semiconductor materials, which are not listed one by one herein.

It should be noted that the material of the first semiconductor layer 12 is different from the material of the second semiconductor layer 13. For example, the material of the first semiconductor layer 12 may be silicon-germanium, and the material of the second semiconductor layer 13 may be silicon; or the material of the first semiconductor layer 12 may be silicon-germanium, and the material of the second semiconductor layer 13 may be polycrystalline silicon; or the material of the first semiconductor layer 12 may be polycrystalline silicon, and the material of the second semiconductor layer 13 may be silicon-germanium.

In an embodiment of this disclosure, the first semiconductor layers 12 and the second semiconductor layers 13 that are alternately deposited may be formed on the substrate 11 by a method such as epitaxial growth, atomic layer deposition, chemical vapor deposition, physical vapor deposition, vacuum deposition, or magnetron sputtering. Certainly, the first semiconductor layers 12 and the second semiconductor layers 13 may be formed by another method. The method of forming the first semiconductor layers 12 and the second semiconductor layers 13 is not specifically limited herein.

As shown in FIG. 1, the first sidewall and the second sidewall that penetrate the first semiconductor layers and the second semiconductor layers are formed in step S120, where the first sidewall and the second sidewall each include the support layer and the isolation layer formed on two sides of the support layer.

Figure 3:
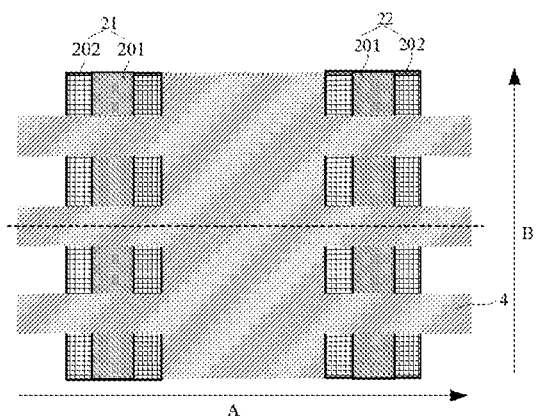
FIG. 3 is a top view of a first sidewall and a second sidewall according to an embodiment of this disclosure.
Figure 4:
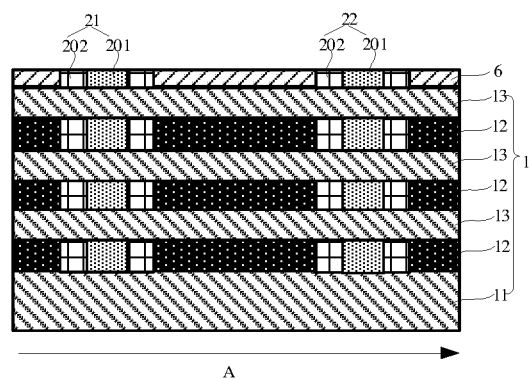
FIG. 4 is a cross-sectional schematic diagram of the semiconductor structure shown in FIG. 3 taken along a dotted line according to an embodiment of this disclosure.

As shown in FIG. 3 and FIG. 4, both the first sidewall 21 and the second sidewall 22 may be strip-shaped, and two ends of each of the strip-shaped first sidewall 21 and the strip-shaped second sidewall 22 may be flush with two ends of the substrate 11 in a second direction B. The first sidewall 21 and the second sidewall 22 may be spaced apart in a first direction A, penetrate the first semiconductor layers 12 and the second semiconductor layers 13 in a direction perpendicular to the substrate 11, and are in contact with the substrate 11 at the bottom of the stacked film layers. The first sidewall 21 and the second sidewall 22 may be supported by the substrate 11 to prevent the first sidewall 21 and/or the second sidewall 22 from collapsing in a manufacturing process, thereby increasing the yield rate.

As shown in FIG. 3 and FIG. 4, the first sidewall 21 and the second sidewall 22 each may include a support layer 201 and an isolation layer 202, and both the support layer 201 and the isolation layer 202 may extend in the extension direction of the first sidewall 21 and the second sidewall 22. The material of the support layer 201 is different from the material of the isolation layer 202 to help selectively etch the isolation layer 202 subsequently. For example, the material of the support layer 201 may be silicon nitride, and the material of the isolation layer 202 may be silicon dioxide.

In an embodiment of this disclosure, forming a first sidewall 21 and a second sidewall 22 that penetrate the first semiconductor layers 12 and the second semiconductor layers 13, where the first sidewall 21 and the second sidewall 22 each include a support layer 201 and an isolation layer 202 formed on a side of the support layer 201 (that is, step S120) may include steps S210 to S260.

Step S210: Etch the base 1 in a direction perpendicular to the base 1 to form a first trench 101 and a second trench 102 that extend in the first direction A and are spaced apart in the second direction B, where the second direction B intersects the first direction A.

Figure 5:
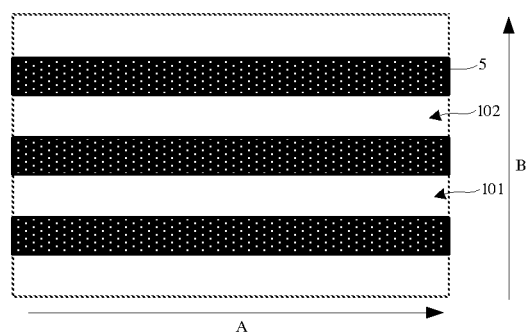
FIG. 5 is a top view of a first trench and a second trench according to an embodiment of this disclosure.

As shown in FIG. 5, a photolithography process may be used to form the first trench 101 and the second trench 102 that are spaced apart in the base 1. Both the first trench 101 and the second trench 102 may extend in the first direction A and be spaced apart in the second direction B. The first direction A may be any direction parallel to the substrate 11, and the second direction B may also be any direction parallel to the substrate 11. The first direction A may intersect the second direction B. For example, the first direction A and the second direction B may be perpendicular to each other.

It should be noted that "perpendicular" may be "absolutely perpendicular" or may be "approximately perpendicular", since deviation inevitably exists in a manufacturing process. In this disclosure, an angle deviation may be caused due to a limitation on the manufacturing process, resulting in an angle deviation between the first direction A and the second direction B. It can be considered that the first direction A is perpendicular to the second direction B, provided that the angle deviation between the first direction A and the second direction B falls within a preset range. For example, the preset range may be 10°. To be specific, when the angle between the first direction A and the second direction B falls within a range greater than or equal to 80° and less than or equal to 100°, it can be considered that the first direction A is perpendicular to the second direction B.

In an embodiment of this disclosure, etching the base 1 in a direction perpendicular to the base 1 to form a first trench 101 and a second trench 102 that extend in the first direction A and are spaced apart in the second direction B (that is, step S210) may include steps S2101 to S2104.

Step S2101: Form a mask layer 5 on the base 1.

As shown in FIG. 2, in an embodiment of this disclosure, the mask layer 5 may be formed on the base 1 through chemical vapor deposition, physical vapor deposition, vacuum deposition, magnetron sputtering, or atomic layer deposition, or by another method. The mask layer 5 may have a multi-layer film structure or may have a single-layer film structure. The material of the mask layer 5 may be at least one of a polymer, $SiO_2$, SiN, polycrystalline silicon, or SiCN, and certainly may be other materials, which are not listed one by one herein. In an embodiment of this disclosure, before the mask layer 5 is formed, a protection layer 6 may be further formed on a surface of the base 1, and the mask layer 5 may be formed on a surface of the protection layer. The material of the protection layer 6 may be an insulation material. For example, the material of the protection layer 6 may be silicon oxide.

Step S2102: Form a first photoresist layer on a surface of the mask layer 5.

The first photoresist layer may be formed on a surface of the mask layer 5 that is away from the base 1 through spin coating or by another method. The material of the first photoresist layer may be a positive photoresist or a negative photoresist, which is not specifically limited herein.

Step S2103: Expose and develop the first photoresist layer to form a plurality of first developing regions that extend in the first direction A and are spaced apart in the second direction B.

The first photoresist layer may be exposed by using a mask, and the pattern of the mask may match the pattern required by the first trench 101 and the second trench 102. Then, the exposed first photoresist layer may be developed to form a plurality of first developing regions that are spaced apart, where each first developing region may expose the surface of the mask layer 5. The pattern of the first developing region may be the same as the pattern required by the first trench 101 and the second trench 102, and the size of the first developing region may be the same as the size required by the first trench 101 and the second trench 102.

Step S2104: Etch the mask layer 5 and the base 1 in each first developing region by using the substrate 11 as an etch stop layer, to form the first trench 101 and the second trench 102 that extend in the first direction A and are spaced apart in the second direction B.

The mask layer 5 may be etched in each first developing region by using an anisotropic etching process. The etched region may expose the base 1 (when the protection layer 6 is formed on the base 1, the etched region may expose the protection layer 6), to from a plurality of mask patterns on the mask layer 5. The mask patterns may be strip-shaped, and orthographic projections of the mask patterns on the base 1 may be flush with two ends of the base 1 in the first direction A. For example, the mask pattern may be a strip-shaped pattern extending in the first direction A, and the plurality of mask patterns may be spaced apart in the second direction B.

It should be noted that, when the mask layer 5 has a single-layer structure, the mask pattern may be formed by using a single etching process. When the mask layer 5 has a multi-layer structure, the film layers may be etched layer by layer, that is, single etching process may etch one layer, and the mask layer 5 may be etched completely by using a multiple etching processes, to form the mask pattern. In an embodiment of this disclosure, the shape and size of the mask pattern may be the same as the pattern and size required by the first trench 101 and the second trench 102.

It should be noted that after the foregoing etching process is completed, the first photoresist layer may be cleaned by using cleaning fluid or removed by using an ashing process, so that the etched mask layer 5 is no longer covered by the first photoresist layer.

The mask layer 5 with a mask pattern may be used as a mask to perform anisotropic etching on the base 1, to form the first trench 101 and the second trench 102 that extend in the first direction A and are spaced apart in the second direction B.

Step S220: Fill a first insulation material in the first trench 101 and the second trench 102 to form a first insulation layer 4.

Figure 6:
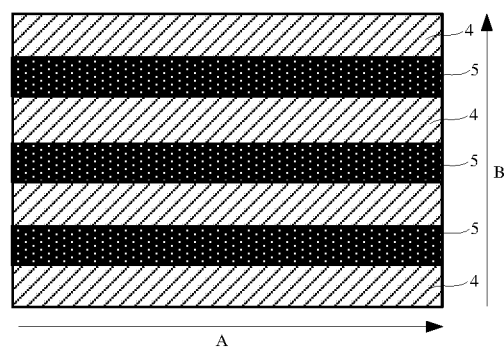
FIG. 6 is a top view of a first insulation layer according to an embodiment of this disclosure.

As shown in FIG. 6, the first insulation material may be filled in the first trench 101 and the second trench 102 by a method such as vacuum deposition, magnetron sputtering, chemical vapor deposition, physical vapor deposition, or atomic layer deposition, to form the first insulation layer 4 in the first trench 101 and the second trench 102. The first trench 101 and the second trench 102 may be filled with the first insulation material. In an embodiment of this disclosure, the first insulation material may be an oxide, for example, may be silicon oxide.

Step S230: Etch the first insulation layer 4 and the first semiconductor layers 12 in the direction perpendicular to the base 1 to form a first accommodation portion 103 and a second accommodation portion 104 that are spaced apart in the first direction A.

Figure 7:
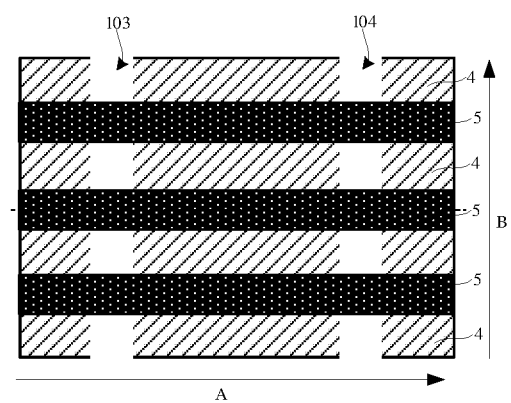
FIG. 7 is a top view of a first accommodation portion and a second accommodation portion according to an embodiment of this disclosure.
Figure 8:
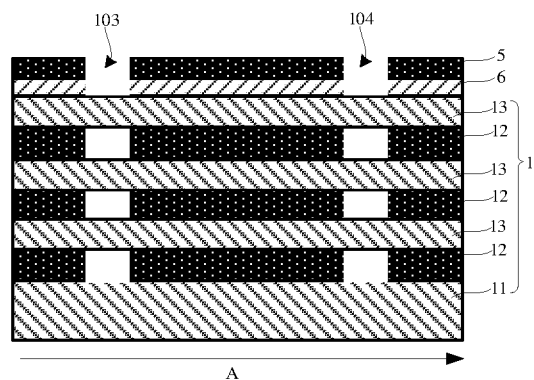
FIG. 8 is a cross-sectional schematic diagram of the semiconductor structure shown in FIG. 7 taken along a dotted line according to an embodiment of this disclosure.

As shown in FIG. 7 and FIG. 8, the first insulation layer 4 and the first semiconductor layer 12 may be etched to form the first accommodation portion 103 and the second accommodation portion 104 in the base 1. The first accommodation portion 103 and the second accommodation portion 104 may be spaced apart in the first direction A, and both may extend in the second direction B.

In an embodiment of this disclosure, etching the first insulation layer 4 and the first semiconductor layer 12 in the direction perpendicular to the base 1 to form a first accommodation portion 103 and a second accommodation portion 104 that are spaced apart in the first direction A (that is, step S230) may include step S2301 and step S2302.

Step S2301: Form a second photoresist layer on a surface of a structure jointly formed by the base 1, the first insulation layer 4, and the mask layer 5, where the second photoresist layer includes a plurality of second developing regions that are spaced apart in the first direction A, and an orthographic projection of each second developing region on the substrate 11 intersects an orthographic projection of each first trench 101 on the substrate 11.

The second photoresist layer may be formed, through spin coating or by another method, on the surface of a structure jointly formed by the base 1, the first insulation layer 4, the protection layer 6, and the mask layer 5. The material of the second photoresist layer may be a positive photoresist or a negative photoresist, which is not specifically limited herein.

The second photoresist layer may be exposed and developed to form a plurality of second developing regions. The second developing regions may be strip-shaped and may be spaced apart in the first direction A. Two ends of the second developing region may be flush with two ends of the first insulation layer 4 in the second direction B. In some embodiments of this disclosure, there may be two second developing regions, and the two second developing regions may extend in the second direction B and may be spaced apart in the first direction A.

In an embodiment of this disclosure, the orthographic projection of the second developing region on the substrate 11 may intersect the orthographic projection of each first trench 101 on the substrate 11. For example, the extension direction of the second developing region may intersect the extension direction of the first trench 101. For example, the extension direction of the second developing region may be perpendicular to the extension direction of the first trench 101.

Step S2302: Perform anisotropic etching on the first insulation layer 4 and the first semiconductor layer 12 in the second developing region to form the first accommodation portion 103 and the second accommodation portion 104 that are spaced apart in the first direction A.

The first insulation layer 4 and the first semiconductor layer 12 may be etched in the second developing region by using an anisotropic etching process, to remove the first insulation layer 4 and the first semiconductor layer 12 in a region that does not overlap the second photoresist layer in the direction perpendicular to the substrate 11, to form the first accommodation portion 103 and the second accommodation portion 104. The first accommodation portion 103 and the second accommodation portion 104 may be spaced apart in the first direction A.

Step S240: Fill a support material in the first accommodation portion 103 and the second accommodation portion 104 to form the support layer 201.

Figure 9:
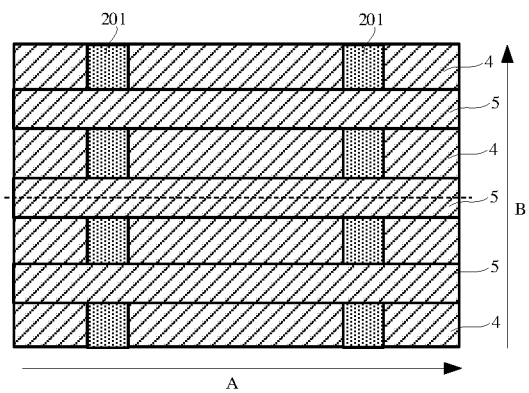
FIG. 9 is a top view of a support layer according to an embodiment of this disclosure.
Figure 10:
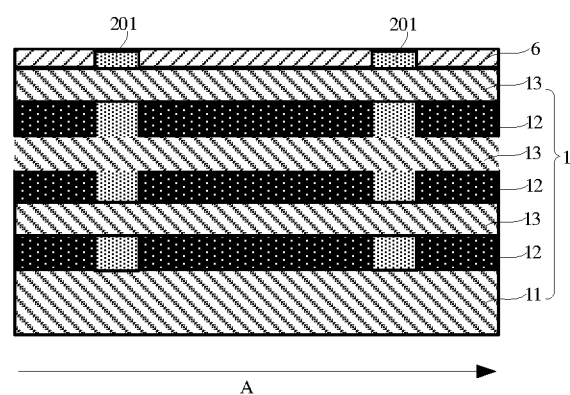
FIG. 10 is a cross-sectional schematic diagram of the semiconductor structure shown in FIG. 9 taken along a dotted line according to an embodiment of this disclosure.

As shown in FIG. 9 and FIG. 10, the support material may be filled in the first accommodation portion 103 and the second accommodation portion 104 by a method such as vacuum deposition, magnetron sputtering, chemical vapor deposition, physical vapor deposition, or atomic layer deposition, and the first accommodation portion 103 and the second accommodation portion 104 may be filled with the support material. In an embodiment of this disclosure, the support material may be a nitride, for example, may be silicon nitride.

In an embodiment of this disclosure, for process convenience, when the support layer 201 is formed, the support material may be simultaneously deposited on the surface of the mask layer 5 and the surface of the first insulation layer 4. Deposition is stopped when the first accommodation portion 103 and the second accommodation portion 104 is filled with support material, and then the top of the base 1 may be flattened. In this process, the mask layer 5 may be removed, so that the top of the support layer 201 is flush with the upper surface of the base 1 (when the protection layer 6 is included, the top of the support layer 201 may be flush with the upper surface of the protection layer 6).

For example, chemical-mechanical polishing may be performed on the top of the base 1 by using a chemical-mechanical polishing process, so that the top of the support layer 201 is flush with the upper surface of the base 1 (when the protection layer 6 is included, the top of the support layer 201 may be flush with the upper surface of the protection layer 6). Certainly, the top of the base may be flattened by other methods, which are not listed one by one herein.

Step S250: Etch the first insulation layer 4 and the first semiconductor layers 12 on the two sides of the support layer 201 to form a first isolation trench 106 and a second isolation trench 107 that expose sidewalls of the support layer 201.

Figure 11:
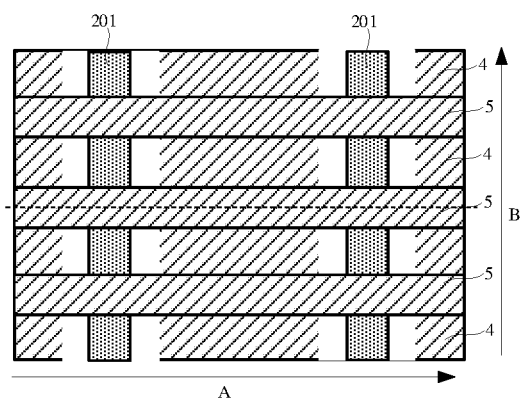
FIG. 11 is a top view of a first isolation trench and a second isolation trench according to an embodiment of this disclosure.
Figure 12:
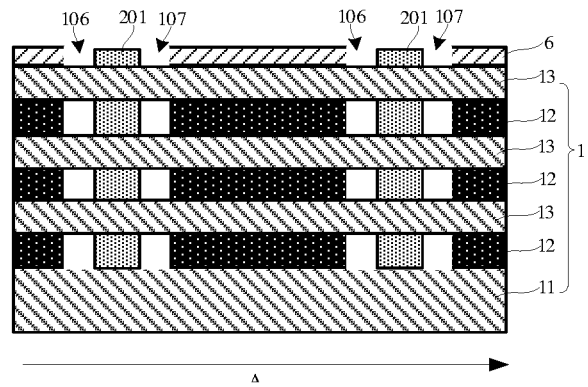
FIG. 12 is a cross-sectional schematic diagram of the semiconductor structure shown in FIG. 11 taken along a dotted line according to an embodiment of this disclosure.

As shown in FIG. 11 and FIG. 12, the first insulation layer 4 and the first semiconductor layer 12 on the two sides of the support layer 201 may be etched by using an anisotropic etching process, to respectively form the first isolation trench 106 and the second isolation trench 107 on the two sides of the support layer 201. Both the first isolation trench 106 and the second isolation trench 107 may expose the sidewalls of the support layer 201.

In some embodiments of this disclosure, the cross section of the first isolation trench 106 and the second isolation trench 107 both may be strip-shaped, the first isolation trench 106 and the second isolation trench 107 may be deposited in parallel, the bottom of the first isolation trench 106 and the second isolation trench 107 both may expose the substrate 11, and the two ends of each of the first isolation trench 106 and the second isolation trench 107 may be flush with the two ends of the first insulation layer 4 in the second direction B (a direction parallel to the substrate 11).

In an embodiment of this disclosure, etching the first insulation layer 4 and the first semiconductor layer 12 on the two sides of the support layer 201 to form a first isolation trench 106 and a second isolation trench 107 that expose sidewalls of the support layer 201 (that is, step S250) may include step S2501 and step S2502.

Step S2501: Form a third photoresist layer on a surface of a structure jointly formed by the support layer 201, the first insulation layer 4, and the base 1, where the third photoresist layer includes a plurality of third developing regions that are spaced apart, and an orthographic projection of each support layer 201 on the substrate 11 is inside an orthographic projection of each third developing region on the substrate 11.

The third photoresist layer may be formed, through spin coating or by another method, on the surface of the structure jointly formed by the support layer 201, the first insulation layer 4, and the base 1 (when the protection layer 6 is included, the third photoresist layer may be formed on the surface of a structure jointly formed by the support layer 201, the first insulation layer 4, the protection layer 6, and the base 1). The material of the third photoresist layer may be a positive photoresist or a negative photoresist, which is not specifically limited herein.

The third photoresist layer may be exposed and developed to form a plurality of third developing regions that are spaced apart. The third developing regions may be strip-shaped and may be spaced apart in the first direction A. Two ends of the third developing region may be flush with the two ends of the first insulation layer 4 in the first direction B. In some embodiments of this disclosure, there may be two third developing regions, and the two third developing regions both may extend in the second direction B and may be spaced apart in the first direction A.

In an embodiment of this disclosure, the orthographic projection of each support layer 201 on the substrate 11 is inside the orthographic projection of each third developing region on the substrate 11. For example, the third developing region may expose the support layer 201, and may further expose a portion of the first insulation layer 4 on the two sides of the support layer 201.

Step S2502: Perform anisotropic etching on the first insulation layer 4 and the first semiconductor layer 12 in the third developing region by using the substrate 11 as an etch stop layer, to form the first isolation trench 106 and the second isolation trench 107 that respectively expose the sidewalls of each support layer 201.

The first insulation layer 4 and the first semiconductor layer 12 may be etched in the third developing region by using an anisotropic etching process, to remove the first insulation layer 4 and the first semiconductor layer 12 in a region that does not overlap the third photoresist layer in the direction perpendicular to the substrate 11, to form the first isolation trench 106 and the second isolation trench 107 that expose the sidewalls of each support layer 201.

Step S260: Fill an isolation material in the first isolation trench 106 and the second isolation trench 107 to form the isolation layer 202.

Still referring to FIG. 3 and FIG. 4, the isolation material may be filled in the first isolation trench 106 and the second isolation trench 107 by a method such as vacuum deposition, magnetron sputtering, chemical vapor deposition, physical vapor deposition, or atomic layer deposition, to form the first isolation layer 202 in the first isolation trench 106 and the second isolation trench 107. The first isolation trench 106 and the second isolation trench 107 may be filled with the isolation material. In an embodiment of this disclosure, the isolation material may be an oxide or nitride, for example, may be silicon oxide or silicon nitride. The isolation layer 202 and the support layer 201 may jointly form the first sidewall 21 and the second sidewall 22.

As shown in FIG. 1, in step S130, the first semiconductor layers located on the side of the first sidewall that is away from the second sidewall and on the side of the second sidewall that is away from the first sidewall are removed to form a plurality of recessed portions separated by the first sidewall, the second sidewall, and the second semiconductor layers, where each recessed portion extends in the horizontal direction, and the plurality of recessed portions are stacked in the vertical direction. The horizontal direction may be any direction parallel to the substrate 11, and the vertical direction may be any direction perpendicular to the substrate 11.

Figure 13:
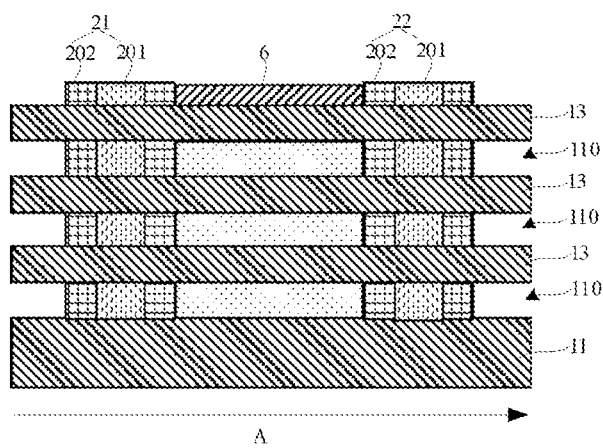
FIG. 13 is a schematic diagram of a semiconductor structure obtained after performing step S130 of FIG. 1 according to an embodiment of this disclosure.

As shown in FIG. 13, the first semiconductor layers 12 located at the end of the two sides of the base 1 may be removed to form space for accommodating a storage capacitor. For example, the first semiconductor layers 12 located on the side of the first sidewall 21 that is away from the second sidewall 22 and on the side of the second sidewall 22 that is away from the first sidewall 21 may be removed to form a plurality of recessed portions 110 that extend in the horizontal direction and are recessed inward in a direction parallel to the substrate 11. The recessed portions 110 may be stacked in the vertical direction. It should be noted that each recessed portion 110 may be surrounded by an isolation layer and the second semiconductor layers 13. For example, each recessed portion 110 located on the side of the first sidewall 21 that is away from the second sidewall 22 may be surrounded by the isolation layer 202 of the first sidewall 21 and the second semiconductor layers 13. For example, sidewalls of the recessed portion 110 may be two adjacent second semiconductor layers 13, and a bottom of the recessed portion 110 may be the isolation layer 202 of the first sidewall 21. Each recessed portion 110 located on the side of the second sidewall 22 that is away from the first sidewall 21 may be surrounded by the isolation layer 202 of the second sidewall 22 and the second semiconductor layers 13. For example, sidewalls of the recessed portion 110 may be two adjacent second semiconductor layers 13, and a bottom of the recessed portion 110 may be the isolation layer 202 of the second sidewall 22.

In an embodiment of this disclosure, the first semiconductor layers 12 located on the side of the first sidewall 21 that is away from the second sidewall 22 and on the side of the second sidewall 22 that is away from the first sidewall 21 may be selectively etched by using the substrate 11 as an etch stop layer and using a selective etching process. For example, a dry etching process or a wet etching process may be used to selectively etch the first semiconductor layers 12 located on the side of the first sidewall 21 that is away from the second sidewall 22 and on the side of the second sidewall 22 that is away from the first sidewall 21. Certainly, another method may be used to remove the first semiconductor layers 12 located on the side of the first sidewall 21 that is away from the second sidewall 22 and on the side of the second sidewall 22 that is away from the first sidewall 21, provided that the first semiconductor layers 12 can be removed without damaging another surrounding structure. The method of removing the first semiconductor layer 12 is not specifically limited herein.

As shown in FIG. 1, in step S140, the first conductive layer attached to the inner wall of each recessed portion is formed in the recessed portion.

Figure 14:
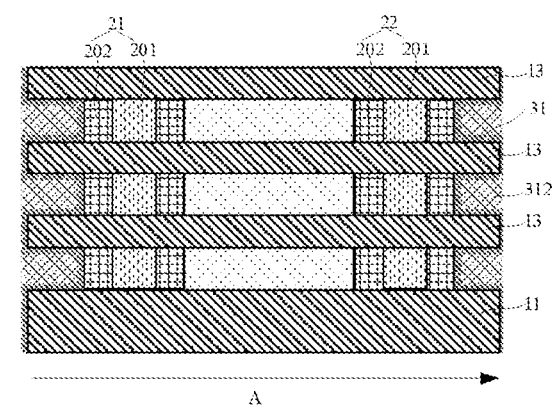
FIG. 14 is a schematic diagram of a filling layer according to an embodiment of this disclosure.

As shown in FIG. 14, a first conductive layer 31 attached to the inner wall of each recessed portion 110 may be formed in the recessed portion 110 by a method such as vacuum deposition, magnetron sputtering, chemical vapor deposition, physical vapor deposition, or atomic layer deposition. The first conductive layer 31 may be used as a lower electrode layer of a subsequently formed storage capacitor 3 to collect charges. The material of the first conductive layer 31 may be a conductive material. For example, the material of the first conductive layer 31 may be rubidium, rubidium oxide, titanium, titanium nitride, tungsten, or the like. Certainly, the material of the first conductive layer 31 may be another material that can be used as an electrode. The material and forming process of the first conductive layer 31 are not specifically limited herein.

In an embodiment of this disclosure, forming, in each recessed portion 110, a first conductive layer 31 attached to an inner wall of the recessed portion 110 (that is, step S140) may include step S310 and step S320.

Step S310: Form, by using an atomic layer deposition process, a conductive material layer 311 attached to a surface of a structure jointly formed by the support layer 201, the isolation layer 202, the substrate 11, and the second semiconductor layer 13.

Figure 15:
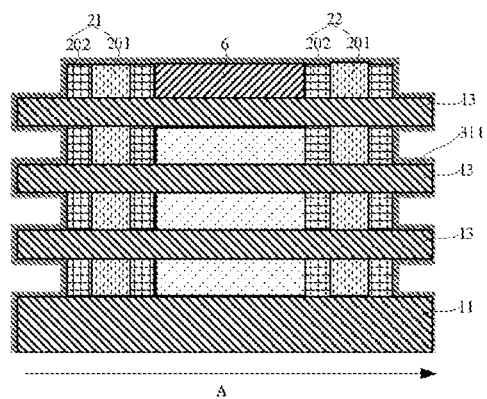
FIG. 15 is a schematic diagram of a conductive material layer according to an embodiment of this disclosure.

As shown in FIG. 15, a uniform non-porous conductive material layer 311 may be formed by using the atomic layer deposition process, and a film thickness of the conductive material layer 311 is precisely controlled, to help improve reliability of the subsequently formed storage capacitor 3. For process convenience, the conductive material layer 311 attached may be formed on the surface of the structure jointly formed by the support layer 201, the isolation layer 202, the substrate 11, and the second semiconductor layer 13. Certainly, the conductive material layer 311 may be formed by using another process, and the method of forming the conductive material layer 311 is not specifically limited herein.

In an embodiment of this disclosure, the thickness of the conductive material layer 311 is far less than the spacing between two adjacent second semiconductor layers 13. In addition, the thickness of the conductive material layer 311 may be far less than the thickness of the second semiconductor layer 13. The material of the conductive material layer 311 may be rubidium, rubidium oxide, titanium, titanium nitride, tungsten, or the like. Certainly, the material of the conductive material layer 311 may be other materials that can be used as an electrode, which are not listed one by one herein.

Step S320: Remove the support layer 201, the isolation layer 202, and the conductive material layer 311 located on a side of the second semiconductor layer 13 farthest away from the substrate 11 that is away from the substrate 11, to form the first conductive layer 31 in each recessed portion 110.

After the conductive material layer 311 is formed, the surface of the base 1 may be flattened. In this process, the support layer 201, the isolation layer 202, and the conductive material layer 311 located on the side of the second semiconductor layer 13 farthest away from the substrate 11 that is away from the substrate 11 may be removed together to form the first conductive layer 31 in each recessed portion 110. In this process, if the protection layer 6 is formed on the base 1, the protection layer 6 may be removed together, to expose an upper surface of the second semiconductor layer 13 farthest away from the substrate 11.

For example, the surface of the base 1 may be flattened by using a chemical-mechanical polishing process. Certainly, the surface of the base 1 may be flatted by another method, provided that the support layer 201, the isolation layer 202, and the conductive material layer 311 located on the side of the second semiconductor layer 13 farthest away from the substrate 11 that is away from the substrate 11 can be removed without damaging another surrounding structure.

As shown in FIG. 1, in step S150, the isolation layers located on the side of the first sidewall that is away from the second sidewall and on the side of the second sidewall that is away from the first sidewall are removed to expose the first conductive layer located at the bottom of each recessed portion on the side close to the support layer.

As shown in FIG. 15, after the conductive material layer 311 is formed, a filling material may be deposited in a structure jointly formed by the substrate 11, the first sidewall 21, the second sidewall 22, the first semiconductor layer 12, the second semiconductor layer 13 (the protection layer 6), and the conductive material layer 311, to form a filling layer 312. The filling layer 312 may fill at least a gap in each recessed portion 110. The first conductive layer 31 may be shielded and supported by the filling layer 312 in the vertical direction, to provide the first conductive layer 31 located on an upper surface and a lower surface of the second semiconductor layer 13 from being damaged or falling off in a subsequent etching process, thereby reducing the possibility of generating structural defects and increasing the yield rate.

Figure 16:
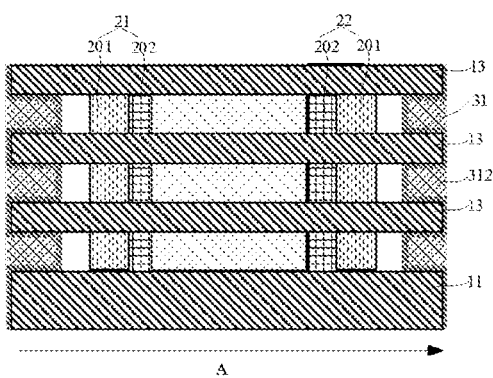
FIG. 16 is a schematic diagram of a semiconductor structure obtained after performing step S150 of FIG. 1 according to an embodiment of this disclosure.

As shown in FIG. 16, the isolation layers 202 located on the side of the first sidewall 21 that is away from the second sidewall 22 and on the side of the second sidewall 22 that is away from the first sidewall 21 may be removed to expose the first conductive layer 31 located at the bottom of each recessed portion 110 on the side close to the support layer 201, that is, expose the first conductive layer 31 located on the sidewall of the isolation layer 202, to help subsequently remove the first conductive layer 31 located on the sidewall of the isolation layer 202.

In an embodiment of this disclosure, the isolation layers 202 located on the side of the first sidewall 21 that is away from the second sidewall 22 and on the side of the second sidewall 22 that is away from the first sidewall 21 may be removed by using a selective etching process to expose the first conductive layer 31 located at the bottom of each recessed portion 110 on the side close to the support layer 201. For example, a photoresist layer may be formed on the top of the first insulation layer 4, the second semiconductor layer 13, the first sidewall 21, the second sidewall 22, and the first conductive layer 31. The photoresist layer may have a first opening exposing the isolation layer 202 located on the side of the first sidewall 21 that is away from the second sidewall 22 and a second opening exposing the isolation layer 202 located on the side of the second sidewall 22 that is away from the first sidewall 21. The isolation layers 202 may be selectively etched at the first opening and the second opening to expose the first conductive layer 31 on the sidewall of the isolation layer 202.

As shown in FIG. 1, in step S160, the first conductive layer located at the bottom of each recessed portion on the side close to the support layer is removed.

Figure 17:
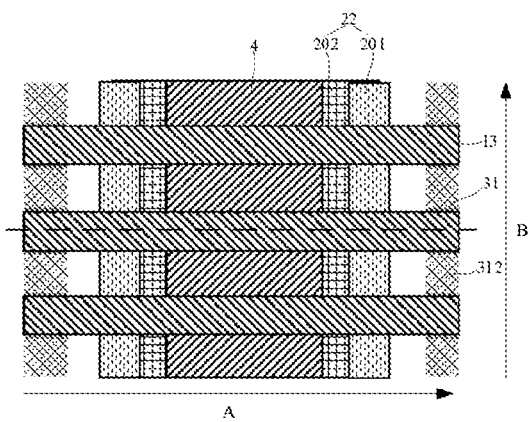
FIG. 17 is a top view of a semiconductor structure obtained after performing step S160 of FIG. 1 according to an embodiment of this disclosure.
Figure 18:
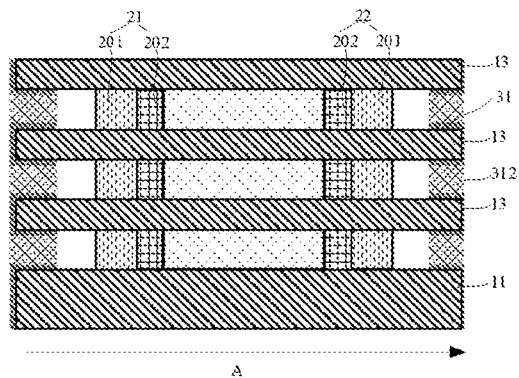
FIG. 18 is a schematic diagram of the semiconductor structure shown in FIG. 17 taken along a dotted line according to an embodiment of this disclosure.

As shown in FIG. 17 and FIG. 18, the first semiconductor layer 12 located at the bottom of each recessed portion 110 may be etched by using space formed after the isolation layers 202 are removed, to avoid short circuiting of the first conductive layer 31 between two adjacent second semiconductor layers 13 due to interconnection, thereby increasing the yield rate. It should be noted that the remaining first conductive layer 31 may be used as a lower electrode layer of a subsequently formed storage capacitor 3 to collect charges. In addition, the remaining first conductive layer 31 may be attached to upper surfaces, lower surfaces, and ends of the second semiconductor layers 13. The first conductive layer 31 may be supported by the second semiconductor layer 13 to prevent the first conductive layer 31 from collapsing, thereby further increasing the yield rate.

In an embodiment of this disclosure, the first conductive layer 31 located at the bottom of each recessed portion 110 on the side close to the support layer 201 may be selectively etched by using a selective etching process. For example, a dry etching process or a wet etching process may be used to selectively etch the first conductive layer 31 located at the bottom of each recessed portion 110 on the side close to the support layer 201. Certainly, another process may be used to selectively etch the first conductive layer 31 located at the bottom of each recessed portion 110 on the side close to the support layer 201. A process of etching the first conductive layer 31 is not specifically limited herein.

In an embodiment of this disclosure, the filling layer may be removed after the first conductive layer 31 located at the bottom of each recessed portion 110 on the side close to the support layer 201 is etched, to expose the remaining first conductive layer 31.

In an embodiment of this disclosure, the forming method in this disclosure may further include step S170 and step S180.

Step S170: Form a dielectric layer 32 on a surface of the first conductive layer 31.

Figure 19:
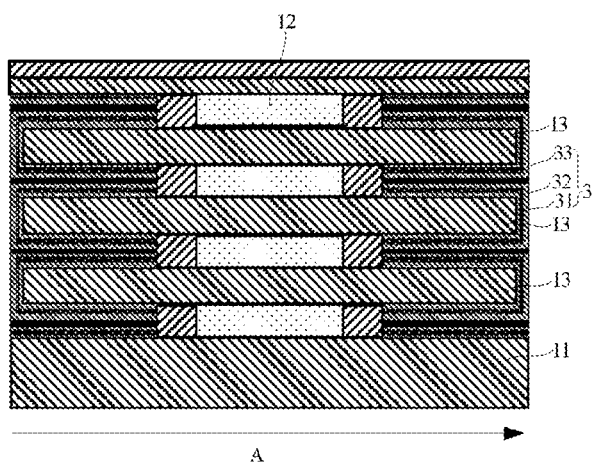
FIG. 19 is a schematic diagram of a storage capacitor according to an embodiment of this disclosure.

As shown in FIG. 19, the dielectric layer 32 may be formed on the surface of the first conductive layer 31. For example, the dielectric layer 32 may be a thin film formed on the surface of the first conductive layer 31. The dielectric layer 32 may be formed by a method such as vacuum deposition, magnetron sputtering, chemical vapor deposition, physical vapor deposition, or atomic layer deposition. Certainly, the dielectric layer 32 may be formed by other methods, which are not listed one by one herein.

The dielectric layer 32 may be a single-layer film structure made of a same material, or may be a hybrid film structure formed by film layers made of different materials. For example, the materials may include a material with a relatively high dielectric constant. For example, the material may be strontium titanate, aluminum oxide, hafnium oxide, lanthanum oxide, titanium oxide, zirconium oxide, tantalum oxide, niobium oxide, strontium oxide, silicon nitride, or a mixture thereof. Certainly, the materials may be other materials, which are not listed one by one herein.

Step S180: Form a second conductive layer 33 on a surface of the dielectric layer 32, where the first conductive layer 31, the dielectric layer 32, and the second conductive layer 33 form a storage capacitor 3.

The material of the second conductive layer 33 may be a conductive material. For example, the material of the second conductive layer 33 may be rubidium, rubidium oxide, titanium, titanium nitride, tungsten, or the like. Certainly, the material of the second conductive layer 33 may be another material that can be used as an electrode. The material of the second conductive layer 33 is not specifically limited herein.

The second conductive layer 33 may be formed on the surface of the dielectric layer 32 by a method such as vacuum deposition, magnetron sputtering, chemical vapor deposition, physical vapor deposition, or atomic layer deposition. Certainly, the second conductive layer 33 may be formed by using another process, which is not specifically limited herein. The second conductive layer 33 may be attached to the dielectric layer 32. In this disclosure, the first conductive layer 31, the dielectric layer 32, and the second conductive layer 33 jointly form the storage capacitor 3.

In an embodiment of this disclosure, a storage capacitor 3 may be formed in each recessed portion 110. In the method form forming a semiconductor structure in this disclosure, a finally formed semiconductor structure includes a plurality of storage capacitors 3. The storage capacitors 3 may be deposited in two rows, and each row may include a plurality of storage capacitors 3 that extend in the horizontal direction and are stacked in the vertical direction.

For example, the two rows of storage capacitors 3 may be separately deposited in edge regions on two sides of the substrate 11. The edge regions on the two sides of the substrate 11 may be separately defined as a first capacitor region and a second capacitor region. A plurality of storage capacitors 3 are separately formed in the first capacitor region and the second capacitor region. The storage capacitors 3 in a same capacitor region all extend in the horizontal direction and are stacked in the vertical direction.

In an embodiment of this disclosure, the forming method in this disclosure may further include step S410 and step S420.

Step S410: Form a third accommodation portion 105 between the support layer 201 of the first sidewall 21 and the support layer 201 of the second sidewall 22.

Figure 20:
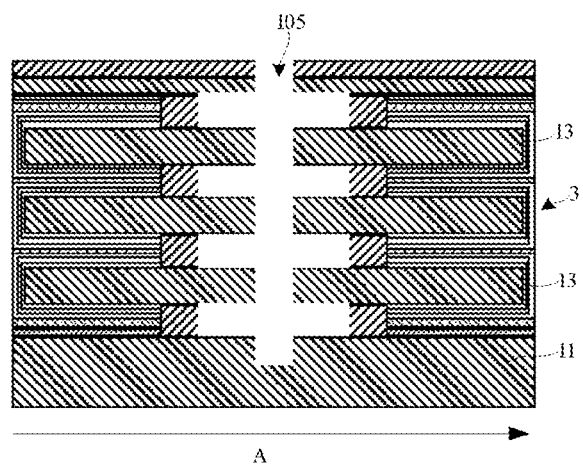
FIG. 20 is a schematic diagram of a third accommodation portion according to an embodiment of this disclosure.

As shown in FIG. 20, in some embodiments of this disclosure, the third accommodation portion 105 may include a plurality of lateral accommodation portions and a plurality of longitudinal accommodation portions. The lateral accommodation portion may extend in the horizontal direction, and the plurality of lateral accommodation portions may be stacked in the vertical direction. The longitudinal accommodation portion may extend in the vertical direction and may penetrate the lateral accommodation portions in the vertical direction. The longitudinal accommodation portion may separate each lateral accommodation portion into two sub-accommodation portions, and the plurality of longitudinal accommodation portions may be spaced apart in the horizontal direction.

Figure 21:
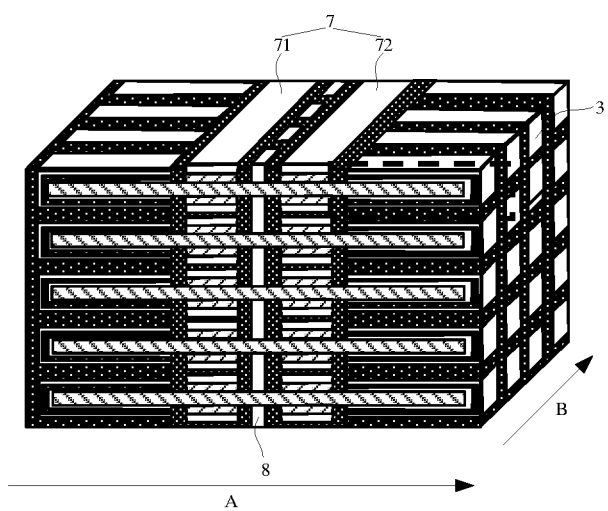
FIG. 21 is a schematic diagram of a semiconductor structure according to an embodiment of this disclosure.

As shown in FIG. 21, the third accommodation portion 105 may be configured to form a word line structure 7 and/or a bit line structure 8. The third accommodation portion 105 may be formed in a middle region of the substrate 11, that is, the word line structure 7 and/or the bit line structure 8 may be formed in the middle region of the substrate 11. For ease of differentiation, the middle region of the substrate 11 may be divided. For example, the middle region of the substrate 11 may include a word line region and a bit line region, where the word line region may include a first word line region and a second word line region that are deposited on two sides of the bit line region. The first capacitor region may be located on a side of the first word line region that is away from the bit line region, and the second capacitor region may be located on a side of the second word line region that is away from the bit line region.

The word line structure 7 may be separately formed in the first word line region and the second word line region, and the word line structure 7 may include a plurality of sub-word lines that extend in the horizontal direction and are stacked in the vertical direction.

The bit line structure 8 may be formed in the bit line region, and the bit line structure 8 may include a plurality of sub-bit lines that extend in the vertical direction and are spaced apart in the horizontal direction.

In an embodiment of this disclosure, forming a third accommodation portion 105 between the support layer 201 of the first sidewall 21 and the support layer 201 of the second sidewall 22 (that is, step S410) may include steps S4101 to S4105.

Step S4101: Remove the remaining isolation layers 202.

The isolation layers 202 located on a side of the first sidewall 21 that is close to the second sidewall 22 and on a side of the second sidewall 22 that is close to the first sidewall 21 may be removed by using a selective etching process, to expose an end of the remaining first semiconductor layer 12.

It should be noted that the dielectric layer 32 of the storage capacitor 3 and the second conductive layer 33 may be formed after the remaining isolation layer 202 is removed.

Step S4102: Form a third semiconductor layer on a surface of a structure jointly formed by the storage capacitor 3, the support layer 201, the substrate 11, the first semiconductor layer 12, and the second semiconductor layer 13, where the third semiconductor layer is filled in a gap in the structure jointly formed by the storage capacitor 3, the support layer 201, the substrate 11, the first semiconductor layer 12, and the second semiconductor layer 13.

After the storage capacitor 3 is formed, an insulation material may be filled in a remaining structure to form the semiconductor layer. The semiconductor layer may be filled in the gap in the structure jointly formed by the storage capacitor 3, the support layer 201, the substrate 11, the first semiconductor layer 12, and the second semiconductor layer 13. In an embodiment of this disclosure, the material of the semiconductor layer may be silicon oxide. Certainly, the material of the semiconductor layer may be another insulation material, which is not specifically limited herein.

Step S4103: Form a fourth photoresist layer on a surface of the third semiconductor layer, where the fourth photoresist layer includes a fourth developing region, and an orthographic projection of the fourth developing region on the substrate 11 is inside an orthographic projection of the first semiconductor layer 12 on the substrate 11.

The fourth photoresist layer may be formed on the surface of the semiconductor layer through spin coating or by another method. The material of the fourth photoresist layer may be a positive photoresist or a negative photoresist, which is not specifically limited herein. The fourth photoresist layer may be exposed and developed to form the fourth developing region. Fourth developing regions may be strip-shaped and may be spaced apart in the second direction B. Two ends of the fourth developing region may be flush with two ends of the third semiconductor layer in the second direction B. The orthographic projection of the fourth developing region on the substrate 11 is inside the orthographic projection of each remaining first semiconductor layer 12 on the substrate 11.

Step S4104: Etch the third semiconductor layer, the first semiconductor layer 12, and the second semiconductor layer 13 in the fourth developing region by using the substrate 11 as an etch stop layer, to form a third trench.

The third semiconductor layer, the first semiconductor layer 12, and the second semiconductor layer 13 may be etched in the fourth developing region by using an anisotropic etching process, to form the third trench exposing the substrate 11. The third trench may be used as a longitudinal accommodation portion. An orthographic projection of the longitudinal accommodation portion on the substrate 11 may overlap the bit line region, and the longitudinal accommodation portion may be configured to form the bit line structure 8. It should be noted that, to ensure that each first semiconductor layer 12 and each second semiconductor layer 13 are etched completely, the first semiconductor layer 12 and the second semiconductor layer 13 may be etched to the inside of the substrate 11 in the etching process.

Step S4105: Remove the remaining first semiconductor layer 12 to form the third accommodation portion 105.

The remaining first semiconductor layer 12 may be removed by using a selective etching process, to form a lateral accommodation portion. The lateral accommodation portion and the longitudinal accommodation portion may jointly form the third accommodation portion 105. For example, the remaining first semiconductor layer 12 may be removed by using a dry etching process or a wet etching process. Certainly, the remaining first semiconductor layer 12 may be removed by another method, provided that the remaining first semiconductor layer 12 can be removed without damaging another surrounding structure. The method of removing the first semiconductor layer 12 is not specifically limited herein.

It should be noted that an orthographic projection of the lateral accommodation portion on the substrate 11 may overlap the word line region, and the lateral accommodation portion may be configured to form the word line structure 7.

Step S420: Form a word line structure 7 and/or a bit line structure 8 in the third accommodation portion 105.

The word line structure 7 and/or the bit line structure 8 may be formed in the third accommodation portion 105, to form a three-dimensional semiconductor structure. For example, the bit line structure 8 may be formed in the longitudinal accommodation portion, and the word line structure 7 may be formed in the lateral accommodation portion.

In an embodiment of this disclosure, forming a word line structure 7 and/or a bit line structure 8 in the third accommodation portion 105 (that is, step S420) may include steps S4201 to S4205.

Step S4201: Form a third conductive layer attached to an inner wall of the third accommodation portion 105.

The third conductive layer attached to an inner wall of the third accommodation portion 105 may be formed in the third accommodation portion 105 by a method such as vacuum deposition, magnetron sputtering, chemical vapor deposition, physical vapor deposition, or atomic layer deposition. The third conductive layer may be configured to form the word line structure 7. The material of the third conductive layer may be a conductive material. For example, the material of the third conductive layer may be titanium nitride, tungsten, or the like. Certainly, the material of the third conductive layer may be another material that can be used as an electrode. The material and a forming process of the third conductive layer are not specifically limited herein.

Step S4202: Fill a second insulation material in the third accommodation portion 105 attached with the third conductive layer to form a second insulation layer.

The second insulation material may be filled in the third accommodation portion 105 attached with the third conductive layer by a method such as vacuum deposition, magnetron sputtering, chemical vapor deposition, physical vapor deposition, or atomic layer deposition. The third accommodation portion 105 may be filled with the second insulation material. In an embodiment of this disclosure, the second insulation material may be a material with a low dielectric constant, for example, may be silicon dioxide.

Step S4203: Form a fifth photoresist layer on a side of the second insulation layer that is away from the substrate 11, where the fifth photoresist layer includes a first photomask and a second photomask spaced apart, the first photomask and the second photomask are located on two sides of the third trench, and orthographic projections of the first photomask and the second photomask on the substrate 11 both partially overlap an orthographic projection, on the substrate 11, of an overlapping region between the third conductive layer and the second insulation layer.

The fifth photoresist layer may be formed on a surface of the second insulation layer through spin coating or by another method. The material of the fifth photoresist layer may be a positive photoresist or a negative photoresist, which is not specifically limited herein. The fifth photoresist layer may be exposed and developed to form the first photomask and the second photomask spaced apart.

The first photomask and the second photomask both may be strip-shaped, and may be spaced apart in the first direction A. Two ends of each of the first photomask and the second photomask may be flush with two ends of the second insulation layer in the second direction B. The first photomask and the second photomask may be respectively located on the two sides of the third trench, and may overlap the overlapping region between the third conductive layer and the second insulation layer. For example, the orthographic projection of the first photomask on the substrate 11 may overlap at least a portion of the first word line region, and the orthographic projection of the second photomask on the substrate 11 may overlap at least a portion of the second word line region.

Step S4204: Etch the second insulation layer and the third conductive layer by using the fifth photoresist layer as a photoresist, to form a first word line 71 and a second word line 72 that are spaced apart.

The first photomask and the second photomask may be used as photoresists to etch the second insulation layer and the third conductive layer, to form the first word line 71 in the first word line region and the second word line 72 in the second word line region.

Step S4205: Form a bit line between the first word line 71 and the second word line 72.

After the word line structure 7 is formed, the second insulation material may be filled in the accommodation portion with the word line structure 7, and then the second insulation material may be etched to form a plurality of bit line trenches that extend in the vertical direction and are spaced apart in the horizontal direction. An orthographic projection of each bit line trench on the substrate 11 overlap at least a portion of the bit line region, and each bit line trench may expose the bit line region of the substrate 11.

A conductive material may be filled in each bit line trench by a method such as vacuum deposition, magnetron sputtering, chemical vapor deposition, physical vapor deposition, or atomic layer deposition, to form the bit line in each bit line trench.

It should be noted that although the steps of the method for forming a semiconductor structure in this disclosure are described in a specific sequence in the accompanying drawing, it is not required or implied that these steps need to be performed in the specific sequence or that all the shown steps need to be performed to achieve a desired result. Additionally or alternatively, some steps may be omitted, a plurality of steps may be combined into one step for execution, one step may be decomposed into a plurality of steps for execution, and/or the like.

An embodiment of this disclosure further provides a semiconductor structure, where the semiconductor structure may include a base 1, a first sidewall 21, a second sidewall 22, and a first conductive layer 31.

The base 1 may include a substrate 11 and a plurality of first semiconductor layers 12 and a plurality of second semiconductor layers 13 that are alternately deposited on the substrate 11, where an orthographic projection of the first semiconductor layer 12 on the substrate 11 is inside an orthographic projection of the second semiconductor layer 13 on the substrate 11.

The first sidewall 21 and the second sidewall 22 may be located at two ends of the first semiconductor layer 12 and penetrate the second semiconductor layers 13. The first sidewall 21 and the second sidewall 22 each include a support layer 201 and an isolation layer 202 formed on a side of the support layer 201. The first sidewall 21, the second sidewall 22, and the second semiconductor layers 13 separate a plurality of recessed portions 110, where each recessed portion 110 extends in a horizontal direction, and the plurality of recessed portions 110 are stacked in a vertical direction.

The first conductive layer 31 may be attached to a sidewall of the recessed portion 110.

An embodiment of this disclosure further provides a semiconductor structure. As shown in FIG. 21, the semiconductor structure may include a substrate 11, a word line structure 7, a bit line structure 8, and a capacitor structure.

The substrate 11 may include a bit line region, a word line region, and a capacitor region that are deposited side by side. The word line region includes a first word line region and a second word line region that are deposited on two sides of the bit line region, and the capacitor region includes a first capacitor region deposited on a side of the first word line region that is away from the bit line region and a second capacitor region deposited on a side of the second word line region that is away from the bit line region.

The word line structure 7 may be formed in the first word line region and the second word line region and include a plurality of sub-word lines that extend in a horizontal direction and are stacked in a vertical direction.

The bit line structure 8 may be formed in the bit line region and include a plurality of sub-bit lines that extend in the vertical direction and are stacked in the horizontal direction.

The capacitor structure may be formed in the capacitor region and include a plurality of storage capacitors 3 that extend in the horizontal direction and are stacked in the vertical direction.

An embodiment of this disclosure further provides a semiconductor structure, where the semiconductor structure may be formed by using a method for forming a semiconductor structure in any one of the foregoing embodiments.

Specific details and beneficial effects of the semiconductor structures provided in the embodiments of this disclosure are described in detail in the embodiments of the method for forming a semiconductor structure in this disclosure. Therefore, details are not described herein again.

An embodiment of this disclosure further provides a memory. The memory may include the semiconductor structure in any one of the foregoing embodiments. Specific details, forming process, and beneficial effects of the memory are described in detail in the corresponding method for forming a semiconductor structure and the semiconductor structure. Therefore, details are not described herein again.

For example, the memory may be a dynamic random-access memory (DRAM), a static random-access memory (SRAM), or the like. Certainly, the memory may be other storage apparatuses, which are not listed one by one herein.

A person skilled in the art may easily figure out another implementation solution of this disclosure after considering the specification and practicing the invention disclosed herein. This application is intended to cover any variations, uses, or adaptations of this disclosure that follow the general principles of this disclosure and include common knowledge or conventional technical means in the art that are not disclosed in this disclosure. The specification and the embodiments are merely considered as examples, and the true scope and spirit of this disclosure are stated by the appended claims.

What is claimed is:

1. A method for forming a semiconductor structure, comprising:
   providing a base, wherein the base comprises a substrate and a plurality of first semiconductor layers and a plurality of second semiconductor layers that are alternately deposited on the substrate;
   forming a first sidewall and a second sidewall that penetrate the first semiconductor layers and the second semiconductor layers, wherein the first sidewall and the second sidewall each comprise a support layer and an isolation layer formed on a side of the support layer;
   removing the first semiconductor layers located on a side of the first sidewall that is away from the second sidewall and on a side of the second sidewall that is away from the first sidewall to form a plurality of recessed portions separated by the first sidewall, the second sidewall, and the second semiconductor layers, wherein the recessed portions extend in a horizontal direction and are stacked in a vertical direction;
   forming, in each recessed portion, a first conductive layer attached to an inner wall of the recessed portion;
   removing the isolation layers located on the side of the first sidewall that is away from the second sidewall and on the side of the second sidewall that is away from the first sidewall to expose the first conductive layer located at a bottom of each recessed portion on a side close to the support layer; and
   removing the first conductive layer located at the bottom of each recessed portion on the side close to the support layer.

2. The forming method according to claim 1, wherein forming a first sidewall and a second sidewall that penetrate the first semiconductor layers and the second semiconductor layers, wherein the first sidewall and the second sidewall each comprise a support layer and an isolation layer formed on a side of the support layer comprises:
   etching the base in a direction perpendicular to the base to form a first trench and a second trench that extend in a first direction and are spaced apart in a second direction, wherein the second direction intersects the first direction;
   filling a first insulation material in the first trench and the second trench to form a first insulation layer;
   etching the first insulation layer and the first semiconductor layers in the direction perpendicular to the base to form a first accommodation portion and a second accommodation portion that are spaced apart in the first direction;
   filling a support material in the first accommodation portion and the second accommodation portion to form the support layers;
   etching the first insulation layer and the first semiconductor layers located on the two sides of the support layers to form a first isolation trench and a second isolation trench that expose sidewalls of the support layers; and
   filling an isolation material in the first isolation trench and the second isolation trench to form the isolation layers.

3. The forming method according to claim 2, wherein etching the base in a direction perpendicular to the base to form a first trench and a second trench that extend in a first direction and are spaced apart in a second direction comprises:
   forming a mask layer on the base;
   forming a first photoresist layer on a surface of the mask layer;
   exposing and developing the first photoresist layer to form a plurality of first developing regions that extend in the first direction and are spaced apart in the second direction; and
   etching the mask layer and the base in each first developing region by using the substrate as an etch stop layer, to form the first trench and the second trench that extend in the first direction and are spaced apart in the second direction.

4. The forming method according to claim 2, wherein etching the first insulation layer and the first semiconductor layers in the direction perpendicular to the base to form a first accommodation portion and a second accommodation portion that are spaced apart in the first direction comprises:
   forming a second photoresist layer on a surface of a structure jointly formed by the base, the first insulation layer, and the mask layer, wherein the second photoresist layer comprises a plurality of second developing regions that are spaced apart in the first direction, and an orthographic projection of each second developing region on the substrate intersects an orthographic projection of each first trench on the substrate; and
   performing anisotropic etching on the first insulation layer and the first semiconductor layers in the second developing region to form the first accommodation portion and the second accommodation portion that are spaced apart in the first direction.

5. The forming method according to claim 3, wherein after forming the support layers, the forming method further comprises:
   flattening a top of the base to remove the mask layer, so that a top of the support layer is flush with the top of the base.

6. The forming method according to claim 2, wherein etching the first insulation layer and the first semiconductor layers located on the two sides of the support layers to form a first isolation trench and a second isolation trench that expose sidewalls of the support layers comprises:
   forming a third photoresist layer on a surface of a structure jointly formed by the support layers, the first insulation layer, and the base, wherein the third photoresist layer comprises a plurality of third developing regions that are spaced apart, and an orthographic projection of each support layer on the substrate is inside an orthographic projection of each third developing region on the substrate; and
   performing anisotropic etching on the first insulation layer and the first semiconductor layers in the third developing region by using the substrate as an etch stop layer, to form the first isolation trench and the second isolation trench that respectively expose the sidewalls of each support layer.

7. The forming method according to claim 1, wherein removing the first semiconductor layers located on a side of the first sidewall that is away from the second sidewall and on a side of the second sidewall that is away from the first sidewall to form a plurality of recessed portions separated by the first sidewall, the second sidewall, and the second semiconductor layers, wherein the recessed portions extend in a horizontal direction and are stacked in a vertical direction comprises:

selectively etching, by using the substrate as an etch stop layer and using a selective etching process, the first semiconductor layers located on the side of the first sidewall that is away from the second sidewall and on the side of the second sidewall that is away from the first sidewall.

8. The forming method according to claim 1, wherein forming, in each recessed portion, a first conductive layer attached to an inner wall of the recessed portion comprises:

forming, by using an atomic layer deposition process, a conductive material layer attached to a surface of a structure jointly formed by the support layers, the isolation layers, the substrate, and the second semiconductor layers; and removing the support layers, the isolation layers, and the conductive material layer located on a side of the second semiconductor layer farthest away from the substrate that is away from the substrate, to form the first conductive layer in each recessed portion.

9. The forming method according to claim 1, wherein removing the isolation layers located on the side of the first sidewall that is away from the second sidewall and on the side of the second sidewall that is away from the first sidewall to expose the first conductive layer located at a bottom of each recessed portion on a side close to the support layer comprises:

removing, by using a selective etching process, the isolation layers located on the side of the first sidewall that is away from the second sidewall and on the side of the second sidewall that is away from the first sidewall to expose the first conductive layer located at the bottom of each recessed portion on the side close to the support layer.

10. The forming method according to claim 1, wherein removing the first conductive layer located at the bottom of each recessed portion on the side close to the support layer comprises:

selectively etching, by using a selective etching process, the first conductive layer located at the bottom of each recessed portion on the side close to the support layer.

11. The forming method according to claim 1, further comprising:

forming a dielectric layer on a surface of the first conductive layer; and forming a second conductive layer on a surface of the dielectric layer, wherein the first conductive layer, the dielectric layer, and the second conductive layer form a storage capacitor.

12. The forming method according to claim 11, further comprising:

forming a third accommodation portion between the support layer of the first sidewall and the support layer of the second sidewall; and forming a word line structure and a bit line structure in the third accommodation portion.

13. The forming method according to claim 12, wherein forming a third accommodation portion between the support layer of the first sidewall and the support layer of the second sidewall comprises:

removing the remaining isolation layers;

forming a third semiconductor layer on a surface of a structure jointly formed by the storage capacitor, the support layers, the substrate, the first semiconductor layers, and the second semiconductor layers, wherein the third semiconductor layer is filled in a gap in the structure jointly formed by the storage capacitor, the support layers, the substrate, the first semiconductor layers, and the second semiconductor layers;

forming a fourth photoresist layer on a surface of the third semiconductor layer, wherein the fourth photoresist layer comprises a fourth developing region, and an orthographic projection of the fourth developing region on the substrate is inside an orthographic projection of the first semiconductor layers on the substrate;

etching the third semiconductor layer, the first semiconductor layers, and the second semiconductor layers in the fourth developing region by using the substrate as an etch stop layer, to form a third trench; and removing the remaining first semiconductor layers to form the third accommodation portion.

14. The forming method according to claim 12, wherein forming a word line structure and/or a bit line structure in the third accommodation portion comprises:

forming a third conductive layer attached to an inner wall of the third accommodation portion;

filling a second insulation material in the third accommodation portion attached with the third conductive layer to form a second insulation layer;

forming a fifth photoresist layer on a side of the second insulation layer that is away from the substrate, wherein the fifth photoresist layer comprises a first photo mask and a second photomask spaced apart, the first photomask and the second photomask are located on two sides of the third trench, and orthographic projections of the first photomask and the second photomask on the substrate both partially overlap an orthographic projection, on the substrate, of an overlapping region between the third conductive layer and the second insulation layer;

etching the second insulation layer and the third conductive layer by using the fifth photoresist layer as a photoresist, to form a first word line and a second word line that are spaced apart; and forming a bit line between the first word line and the second word line.

* * * * *